United States Patent [19]

Groeneveld et al.

[11] Patent Number: 5,296,752
[45] Date of Patent: Mar. 22, 1994

[54] CURRENT MEMORY CELL

[75] Inventors: Dirk W. J. Groeneveld; Hendrikus J. Schouwenaars, both of Eindhoven, Netherlands

[73] Assignee: U.S. Philips Corporation, N.Y.

[21] Appl. No.: 870,657

[22] Filed: Apr. 20, 1992

[30] Foreign Application Priority Data

May 8, 1991 [EP] European Pat. Off. ........ 91201102-0

[51] Int. Cl.⁵ ........................................ H03K 17/687
[52] U.S. Cl. ..................... 307/353; 307/571; 307/279; 307/246; 323/315; 365/187
[58] Field of Search ............ 307/246, 352, 353, 272.1, 307/279, 490, 571; 323/315; 365/49, 181, 187

[56] References Cited

U.S. PATENT DOCUMENTS

| | | | |
|---|---|---|---|
| 4,958,123 | 9/1990 | Hughes | 307/353 |
| 5,021,692 | 6/1991 | Hughes | 307/353 |
| 5,023,489 | 6/1991 | Macbeth | 307/490 |
| 5,028,822 | 7/1991 | Hughes | 323/315 |
| 5,109,169 | 4/1992 | Hughes | 307/246 |

OTHER PUBLICATIONS

IEE Proceedings G. Electronic Circuits & Systems, vol. 137, No. 2, Apr. 1990, Stevenage GB, pp. 95-100, Wegmann Basic Principles of Accurate Dynamic Current Mirrors.
Electronics Letters, vol. 26, No. 19, Sep. 1990, Enage GB pp. 1593-1595, Toumazou et al. High Performance Algorithmic Switched Current Memory Cell.

Primary Examiner—William L. Sikes
Assistant Examiner—My Trang Ton
Attorney, Agent, or Firm—Bernard Franzblau

[57] ABSTRACT

A current memory cell for sampling a current (I) at a current terminal (5) during a sample interval and for applying the current (I) to the current terminal (5) during a hold interval. A first switch (S1) connects a PMOS transistor (P1) as a diode during the sample interval and as a current source during the hold interval. During the sample interval the current in the current terminal (5) is mirrored to the PMOS transistor (P1). During the hold interval the current of the PMOS transistor is mirrored to the current terminal. The mirroring is effected by means of two NMOS transistors (N1, N2) and one reversing switch (S2), which reverses the input and output of the current mirror circuit between the sample intervals and the hold intervals. The current mirror circuit (N1, N2) and the PMOS current source (P1) collectively behave as a current sink which is insensitive to the substrate voltages which are caused by the body effect.

21 Claims, 4 Drawing Sheets

CURRENT MEMORY CELL

BACKGROUND OF THE INVENTION

This invention relates to a current memory cell for applying to a current terminal, during a hold interval, an output current which is substantially equal to an input current forced onto the current terminal during a sample interval preceding the hold interval, comprising:
- a first current terminal,
- a first transistor having a source, a drain and a gate, the drain being coupled to the first current terminal,
- a capacitor inserted between the source and gate of the first transistor, and
- a first switch for coupling the gate of the first transistor to the first current terminal during the sample interval.

A current memory cell of this type is known from U.S. Pat. No. 4,967,140. Current memory cells of this prior-art type are used as a current source that can be calibrated in accurate digital-to-analog converters, as a current memory in analog discrete-time signal processing (switched current technique), dynamic current mirror circuits and current dividers. They are also termed current copiers.

The first transistor of the current memory cell is often an NMOS transistor in a P-type substrate of an integrated circuit. Owing to the body effect the current memory cell is sensitive to substrate voltage variations caused by, for example, a digital circuit realised on the same substrate. During the hold interval the gate of the NMOS transistor has a tri-state, the voltage on the capacitor built up by the forced current during the sample interval insures that the supplied current is maintained. Voltage variations between the source and the substrate may then affect the supplied current as a result of the body effect. The effect may be reduced by locally connecting the substrate to the source. However, this has only a partial effect because the substrate underneath the gate cannot be reached directly. Furthermore, for different reasons it is often undesired to connect the source of the current memory cell to the substrate. The NMOS current memory cell is also sensitive to minority carriers which are generated by a noise source located on the same chip and are captured by the NMOS transistor.

For specific applications it is possible to use PMOS current memory cells in lieu of NMOS current memory cells, the PMOS transistor being embedded in an N-well which may be connected to any desired noise-free voltage. This solution is only possible if the direction of the forced input current and the supplied output current in a system does not play any part. However, there are also systems in which the use of both types of current memory cells is necessary, such as two-way digital-to-analog converters. One type of current memory cell (NMOS) then operates as a current sink and the other type of current memory cell (PMOS) as a current source.

SUMMARY OF THE INVENTION

It is an object of the invention to provide a current memory cell of the current sink type which is less sensitive to the substrate voltage variations and to minority carriers of noise sources on the same chip.

According to the invention a first variant of a current memory cell of the type mentioned in the preamble is characterized in that the current memory cell further includes:
- a second current terminal,
- second and third transistors of a conductivity type opposite to that of the first transistor and each having a source, drain and gate, the drain of the second transistor being coupled to the first current terminal and the drain of the third transistor to the second current terminal, the gate of the second transistor being connected to the gate of the third transistor and gate-source junctions formed by the gates and sources of the second and third transistors being connected in parallel, and
- a second switch for coupling the gates of the second and third transistors to the first current terminal during the hold interval and to the second current terminal during the sample interval.

In combination with the second switch the second and third transistors form an NMOS current mirror circuit which has an input and an output which are reversed in the sample intervals and the hold intervals. In the sample interval the current forced onto the second current terminal is mirrored to the first current terminal and forced onto the first transistor. In the hold interval the current to be held of the first transistor flows to the first current terminal and is mirrored to the second current terminal. An inaccuracy that may occur in the current mirror circuit does not play any role because this inaccuracy in the hold interval is the reverse of that in the sample interval. Substrate voltage variations do not play any role in the current transfer of the current mirror circuit either because these variations have the same effect on both transistors. A first transistor arranged as a current source and the current mirror circuit collectively form a current memory cell of the current sink type which is insensitive to substrate voltage variations. Because the first transistor has an opposite conductivity type (PMOS), it is inserted into a separate N-well which avoids minority carriers entering.

A second variant of a current memory cell of the type mentioned in the opening paragraph is characterized, according to the invention, in that the current memory cell further includes:
- a second current terminal
- second and third transistors of a conductivity type opposite to that of the first transistor and each having a source, drain and gate, the drain of the second transistor being coupled to the first current terminal and the drain of the third transistor to the second current terminal, the gate of the second transistor being connected to the gate of the third transistor and gate-source junctions formed by the gates and sources of the second and third transistors being connected in parallel,
- means for producing a substantially constant voltage difference between the gate of the third transistor and the second current terminal, and
- a bias current source which is coupled to the second current terminal.

The second and third transistors now also form an NMOS current mirror circuit. Its input is the second current terminal and receives the current from the bias current source. The output is coupled to the first current terminal. During the sample intervals a current equal to the difference between a current forced onto the first current terminal and the mirrored current of the bias current source flows through the diode-arranged first transistor. During the hold intervals a current equal to the sum of the current in the first transistor functioning as a current source and the mirrored current of the bias current source is available at the first current terminal. Any inaccuracy in the current mirror circuit plays no role in this second variant. Substrate voltage variations now do not affect the current transfer of the current mirror circuit either because these variations have the same effect on both transistors. The combination of a current-source-arranged first transistor and the current mirror circuit again constitutes a current memory cell of the current sink type which is insensitive to substrate voltage variations. Also in this case the first transistor has an opposite conductivity type (PMOS) and is inserted in a separate N-well that avoids minority carriers entering.

Needless to observe that in both variants the same advantageous effects may also be obtained if the conductivity types of the substrate and the transistors are selected to be each other's opposite, that is to say, an N-type substrate, a PMOS current mirror circuit and an NMOS storage transistor in a P-well.

A further embodiment of both variants of a current memory cell according to the invention is characterized in that at least one of the drains of the first, second and third transistors is coupled to the associated current terminal via a cascode circuit, comprising:
  a further bias current source,
  a cascode transistor and a negative feedback transistor both of the same conductivity type as that of the associated first, second and third transistors, and having a source, drain and gate, the drain of the cascode transistor being connected to the associated current terminal, the source of the cascode transistor and the gate of the negative feedback transistor being connected to the drains of the associated first, second and third transistors, the source of the negative feedback transistor being coupled to the sources of the associated first, second and third transistors and the drain of the negative feedback transistor and the gate of the cascode transistor being connected to the bias current source.

The cascode circuits considerably increase the output impedances of the first, second and/or third transistors. Consequently, voltage variations on the first and second current terminals do not substantially affect the currents flowing through the current terminals, which augments the accuracy of the current memory cell.

BRIEF DESCRIPTION OF THE DRAWING

The invention will now be further explained with reference to the annexed drawin Figures, in which.

In these drawing Figures components having the same function or meaning have like reference characters.

DESCRIPTION OF THE PREFERRED EMBODIMENTS

Figure 1:
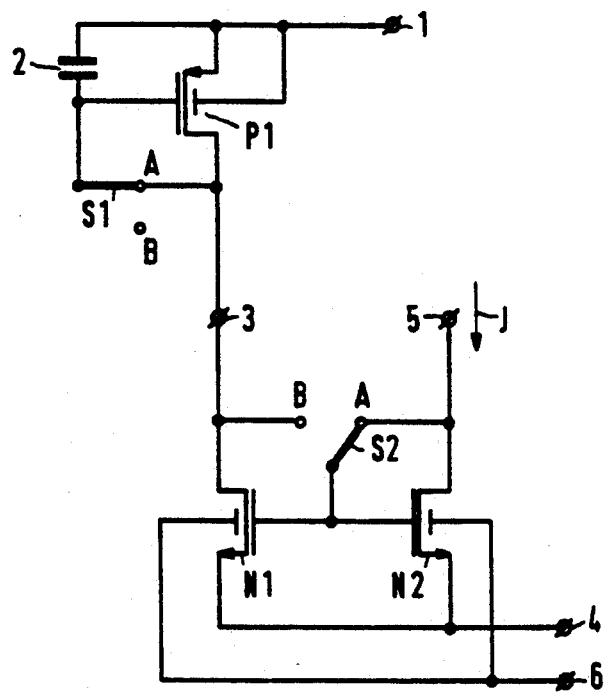
FIG. 1 shows an embodiment of a first variant of a current memory cell according to the invention.

FIG. 1 shows an embodiment of a first variant of a current memory cell according to the invention. The source of a PMOS transistor P1 is connected to a positive supply terminal 1. The gate-source junction of this transistor is by-passed by a capacitor 2, which may be formed by a separate capacitor or by the internal gate-source capacitance of transistor P1. The drain of transistor P1 is coupled to a first current terminal 3. A first switch S1 is inserted between the gate of transistor P1 and the current terminal 3. The switch S1 has two states, referenced A and B. In state A the switch S1 connects the gate of transistor P1 to the current terminal 3. In state B this connection is interrupted. The current memory cell further includes two NMOS transistors N1 and N2, whose sources are connected to a negative supply terminal 4 and whose gates are interconnected. The drain of transistor N1 is coupled to the first current terminal 3. The drain of transistor N2 is coupled to a second current terminal 5. A second switch S2 connects the gates of the transistors N1 and N2 in state A to the second current terminal and in state B to the first current terminal. The transistors N1 and N2 are realised in a substrate to which a substrate voltage may be applied through a substrate terminal 6. Transistor P1 is accommodated in an N-well which is connected to the positive supply terminal 1 by way of example.

During a sample interval the switches S1 and S2 have adopted state A. The transistors N1 and N2 then form a current mirror circuit of which the second current terminal 5 forms the input and the first current terminal 3 the output. A current I applied to the second current terminal 5 by a current source (not shown) is mirrored to current terminal 3 and flows through the transistor P1 arranged as a diode. A voltage indicative of the current flowing through transistor P1 is built up across the capacitor 2. After the sample interval comes the hold interval. The switches S1 and S2 then have adopted state B. The transistors N1 and N2 now form a current mirror circuit whose first current terminal 3 is the input and the second current terminal 5 the output. Transistor P1 is now arranged as a current source and applies to current terminal 3 a current which is as large as the current that flowed through the transistor P1 in the previous sample interval. This current is copied to the second current terminal 5 by the transistors N1 and N2 and flows to a load (not shown).

At current terminal 5 the transistor configuration P1, N1 and N2 behaves as a current sink, that is to say, the current I is captured by the current terminal 5. Such a current sink is also possible with a single NMOS transistor with a switch in a configuration which is complementary to that of transistor P1 and switch S1. In that case, due to the body effect, substrate voltages will affect the supplied current. The effect can be reduced by locally connecting the substrate to the source of the single NMOS transistor. This is not always sufficient because the substrate underneath the gate cannot be reached. Furthermore, especially with complex integrated circuits it is often undesired to link the negative supply terminal 4, to which the source is connected, to the substrate connection 6. The current memory cell as shown in the Figure behaves like a current sink which is insensitive to substrate voltages. The PMOS transistor P1 is embedded in an N-well which may be connected to a noise-free voltage. The transfer of the current mirror circuit N1-N2 is unaffected by the substrate voltages because they affect these transistors N1 and N2 in equal measure.

Any inequality of the transistors N1 and N2 does not play a part in the accuracy with which the current memory cell in the hold interval copies the current presented in the sample interval. The copies in the sample intervals and the hold intervals are each other's opposite so that the inequality is eliminated.

The switches S1 and S2 may be formed in known fashion by, for example, MOS transistors.

The accuracy of the current memory cell is also determined by the voltage variations on the current terminals 3 and 5. These variations affect the currents through these current terminals which currents result from finite output impedances of the transistors P1, N1 and N2. By cascoding these transistors the output impedance may be enlarged.

Figure 2:
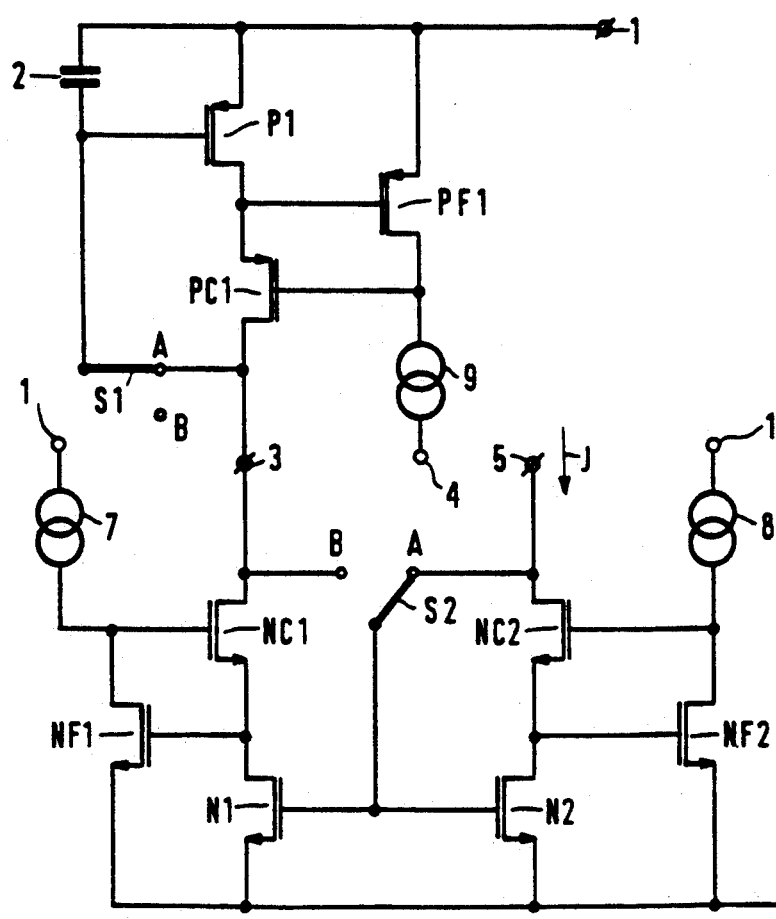
FIG. 2 shows a first further embodiment of the first variant of a current memory cell according to the invention.

FIG. 2 shows a first further embodiment of the first variant of a current memory cell in which the transistors P1, N1 and N2 each comprise a cascode circuit. However, there may also be situations in which not all transistors comprise a cascode circuit. The cascode circuit for transistor N1 comprises a cascode transistor NC1, a negative feedback transistor NF1 and a bias current source 7. The cascode transistor NC1 and the negative feedback transistor NF1 are of the same conductivity type as transistor N1. The drain of the cascode transistor NC1 is connected to the first current terminal 3. The source of the cascode transistor NC1 is connected to the drain of transistor N1 and to the gate of the negative feedback transistor NF1, whose source is connected to the negative supply terminal 4. The gate of the cascode transistor NC1 is connected to the drain of the negative feedback transistor NF1. The bias current source 7 applies a bias current to the drain of the negative feedback transistor NF1 and also forms a high-impedance load for the negative feedback transistor NF1. The variations in the drain-source voltage of transistor N1 are amplified and inverted by the negative feedback transistor NF1 and fed back through the cascode transistor NC1. The current supplied by transistor N1 is thus substantially constant. Similar cascode circuits are arranged for the transistors N2 and P1, the cascode transistors being referenced NC2 and PC1 respectively, the negative feedback transistors NF2 and PF1 respectively, and the bias current sources 8 and 9, respectively. The manner in which the bias current sources 7, 8 and 9 are connected is not critical and may be implemented in various ways. For example, the unconnected terminals of bias current sources 7 and 8 may be connected to the supply terminal 1 and that of bias current source 9 to the supply terminal 4.

Figure 3:
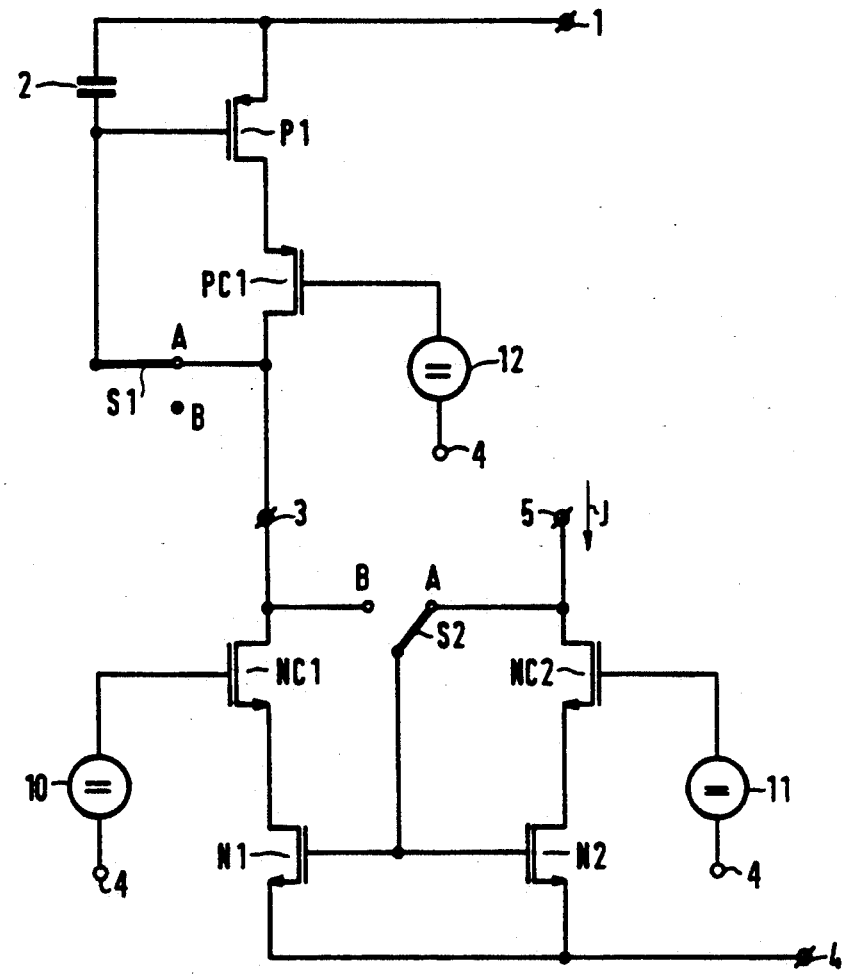
FIG. 3 shows a second further embodiment of the first variant of a current memory cell according to the invention.

FIG. 3 shows a second further embodiment of the first variant comprising an alternative cascode circuit for the transistors P1, N1 and N2. The negative feedback transistors NF1, NF2 and PF1 of the circuit shown in FIG. 2 have been omitted and the bias current sources 7, 8 and 9 are replaced with the bias voltage sources 10, 11 and 12 applying a suitably selected bias current to the gates of the cascode transistors NC1, NC2 and PC1. In a manner similar to FIG. 2, the connections of the bias voltage sources 10, 11 and 12 may be implemented in various ways, for example, by connecting the unconnected terminals to supply terminal 4.

Figure 4:
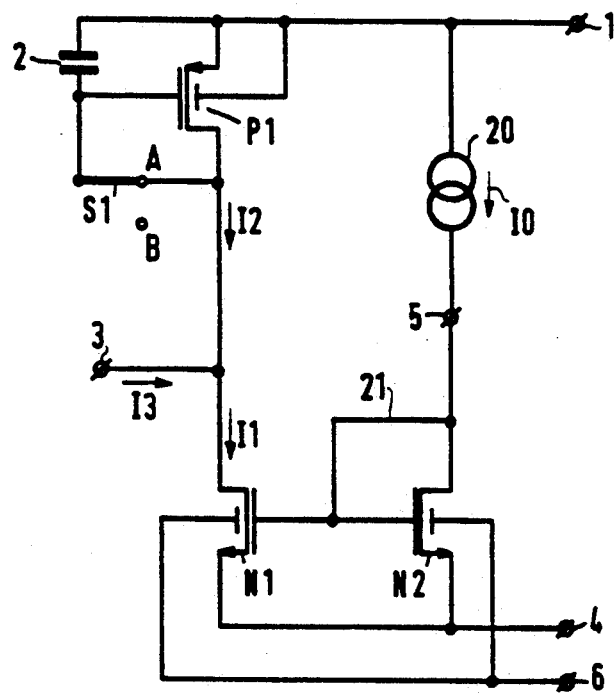
FIG. 4 shows an embodiment of a second variant of a current memory cell according to the invention.

FIG. 4 shows a second variant of a current memory cell. The circuit shows much similarity to the circuit of the first variant shown in FIG. 1. From this second variant the switch S2 is omitted. The voltage difference between the gate of transistor N2 and the second current terminal 5 is maintained at a constant level by means of a short-circuiting line 21. A similar effect may be obtained by means of a voltage-follower, for example, a source-follower, whose gate is connected to the second current terminal 5 and whose source is connected to the gate of transistor N2. The transistors N1 and N2 now form a current mirror circuit in which the second current terminal 5 is the input and the first current terminal is the output. The second current terminal 5 is coupled to a bias current source 20 which produces a bias current I0. This bias current I0 is mirrored and flows as a mirrored current I1 to the first current terminal 3. During the sample intervals switch S1 is in state A. A current I3 is then forced onto the first current terminal 3 by a current source (not shown). A difference current I2 equal to I1−I3 then flows through the transistor P1. During the hold intervals the switch S1 is in state B. Transistor P1 then supplies the current I2=I1−I3 to the first current terminal 3, while the current I1 is still being derived from that terminal by the current mirror circuit transistors N1 and N2. A current may now be supplied to the first current terminal 3 which is equal to I2−I1=I3. The current forced onto the first current terminal 3 during the sample intervals is thus available across a load (not shown any further) during the hold intervals.

Figure 5:
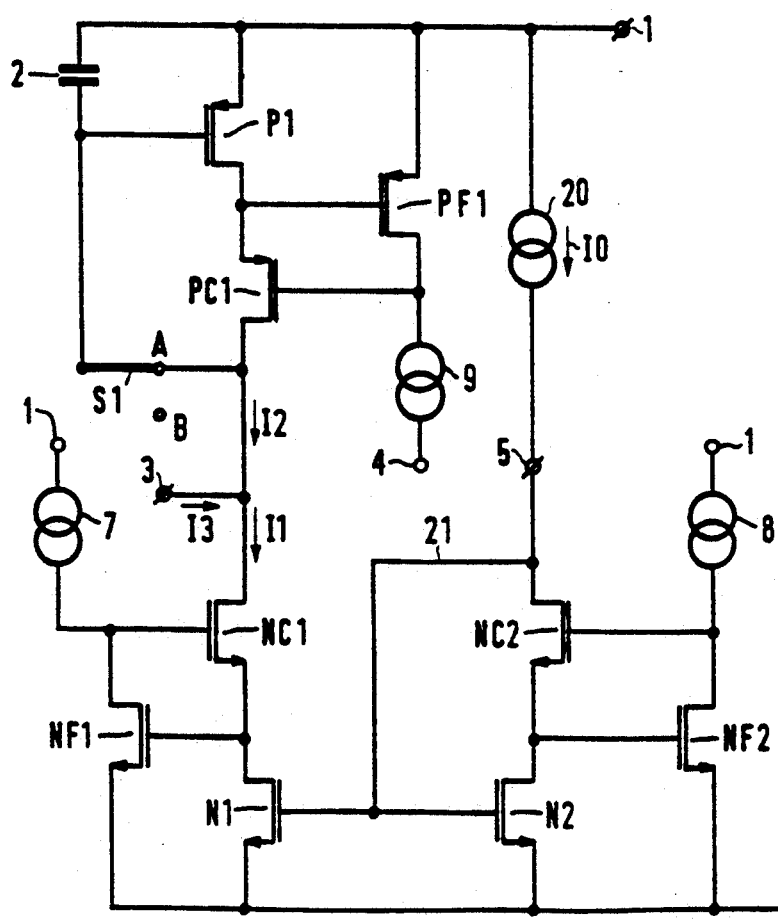
FIG. 5 shows a first further embodiment of the second variant of a current memory cell according to the invention.
Figure 6:
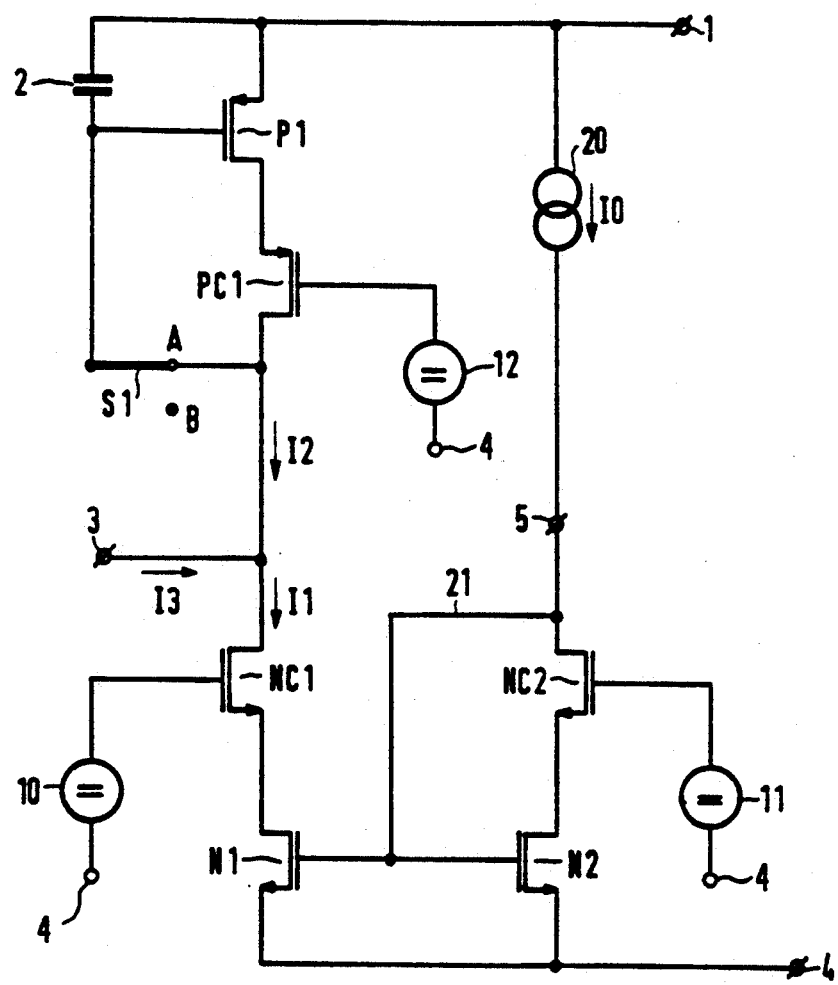
FIG. 6 shows a second further embodiment of the second variant of a current memory cell according to the invention.

FIGS. 5 and 6 show first and second embodiments of the second variant whose features correspond to those of FIGS. 2 and 3 respectively, and therefore do not require additional explanation. The bias current sources 7, 8, and 9 of FIG. 5 and the bias voltage sources 10, 11 and 12 of FIG. 6 may be connected in a manner similar to that described above for FIGS. 2 and 3, respectively.

The variants of the current memory cell have been explained having two NMOS transistors N1 and N2 in a P-type substrate and one PMOS transistor in an N-well. Naturally, it is alternatively possible to use an N-type substrate as a basic material comprising two PMOS transistors as a current mirror circuit and one NMOS transistor in a P-well as a storage current source.

We claim:

1. A current memory cell for applying to a current terminal, during a hold interval, an output current which is substantially equal to an input current forced onto the current terminal during a sample interval preceding the hold interval, comprising:
a first current terminal,
a first transistor having a source, a drain and a gate, the drain being coupled to the first current terminal,
a capacitor connected between the source and gate of the first transistor, and
a first switch for coupling the gate of the first transistor to the first current terminal during the sample interval, characterized in that the current memory cell further includes:
a second current terminal,
second and third transistors of a conductivity type opposite to that of the first transistor and each having a source, drain and gate, the drain of the second transistor being coupled to the first current terminal and the drain of the third transistor to the second current terminal, the gate of the second transistor being connected to the gate of the third transistor and gate-source circuits of the second and third transistors being connected in parallel, and a second switch for coupling the gates of the second and third transistors to the first current terminal during the hold interval and to the second current terminal during the sample interval.

2. A current memory cell as claimed in claim 1 wherein at least one of the drains of the first, second and third transistors is coupled to the associated current terminal via a cascode circuit, the cascode circuit comprising:

a bias current source, a cascode transistor and a negative feedback transistor each of the same conductivity type as that of the associated first, second and third transistors, and having a source, drain and gate, the drain of the cascode transistor being connected to the associated current terminal, the source of the cascode transistor and the gate of the negative feedback transistor being connected to the drain of an associated first, second and third transistor, the source of the negative feedback transistor being coupled to the source of an associated first, second and third transistor and the drain of the negative feedback transistor and the gate of the cascode transistor being connected to the bias current source.

3. A current memory cell as claimed in claim 1 wherein at least one of the drains of the first, second and third transistors is coupled to the associated current terminal by means of a cascode circuit which comprises:

a bias voltage source, and a cascode transistor of the same conductivity type as that of the associated first, second and third transistors, and having a source, drain and gate, the drain of the cascode transistor being connected to the associated current terminal, the source of the cascode transistor being connected to an respective drain of the associated first, second and third transistors, and the gate of the cascode transistor being connected to the bias voltage source.

4. A current memory cell for applying to a current terminal, during a hold interval, an output current which is substantially equal to an input current forced onto the current terminal during a sample interval preceding the hold interval, comprising:

a first current terminal, a first transistor having a source, a drain and a gate, the drain being coupled to the first current terminal, a capacitor connected between the source and gate of the first transistor and a switch for coupling the gate of the first transistor to the first current terminal during the sample interval, characterized in that the current memory cell further includes:

a second current terminal, second and third transistors of a conductivity type opposite to that of the first transistor and each having a source, drain and gate, the drain of the second transistor being coupled to the first current terminal and the drain of the third transistor to the second current terminal, the gate of the second transistor being connected to the gate of the third transistor and gate-source circuits of the second and third transistors being connected in parallel, means for creating a substantially constant voltage difference between the gate of the third transistor and the second current terminal and, a bias current source coupled to the second current terminal.

5. A current memory cell as claimed in claim 4 wherein at least one of the drains of the first, second and third transistors is coupled to the associated current terminal via a cascode circuit, the cascode circuit comprising:

a further bias current source, a cascode transistor and a negative feedback transistor each of the same conductivity type as that of the associated first, second and third transistors, and having a source, drain and gate, the drain of the cascode transistor being connected to the associated current terminal, the source of the cascode transistor and the gate of the negative feedback transistor being connected to the drain of an associated first, second and third transistor, the source of the negative feedback transistor being coupled to the source of an associated first, second and third transistor and the drain of the negative feedback transistor and the gate of the cascode transistor being connected to the further bias current source.

6. A current memory cell as claimed in claim 4 wherein at least one of the drains of the first, second and third transistors is coupled to the associated current terminal by means of a cascode circuit which comprises:

a bias voltage source, and a cascode transistor of the same conductivity type as that of the associated first, second and third transistors, and having a source, drain and gate, the drain of the cascode transistor being connected to the associated current terminal, the source of the cascode transistor being connected to an respective drain of the associated first, second and third transistors, and the gate of the cascode transistor being connected to the bias voltage source.

7. A current memory cell as claimed in claim 4 wherein the first and second current terminals, the first, and third transistors and the first and second switches are all part of an integrated circuit, and said constant voltage difference is maintained during both the sample interval and the hold interval.

8. A current memory cell for sampling a current during a sample interval and for supplying a corresponding current during a hold interval, comprising:

first and second terminals for a supply voltage, a first current terminal, a first transistor having a control electrode, first means for coupling said first current terminal to the first supply voltage terminal via said first transistor, a capacitor connected between the control electrode and a first main electrode of the first transistor, a first switch for coupling and decoupling the first transistor control electrode to and from the first current terminal during the sample interval and the hold interval, respectively, a second current terminal, second and third transistors of a conductivity type opposite to that of the first transistor and having their control electrodes interconnected, second means for coupling the first current terminal to the second supply voltage terminal via the second transistor, third means for coupling the second current terminal to the second supply voltage terminal via the third transistor, and a second switch for coupling the interconnected control electrodes of the second and third transistors to the first current terminal during the hold interval and to the second current terminal during the sample interval.

9. A current memory cell as claimed in claim 8 wherein said second and third transistors together form a current mirror circuit wherein, by operation of the second switch, the second and first current terminals form the input and output terminals, respectively, of the current mirror circuit during the sample interval and form the output and input terminals, respectively, of the current mirror circuit during the hold interval.

10. A current memory cell as claimed in claim 8 wherein the first and second switches are switched in synchronism.

11. A current memory cell as claimed in claim 8 wherein at least one of the first, second and third transistors is coupled to its respective current terminal via a respective cascode circuit comprising:

a source of bias current, a cascode transistor coupled between a respective first, second or third transistor and its respective current terminal, a feedback transistor coupled to a control electrode of its respective cascode transistor, and fourth means coupling the bias current source to the feedback transistor and to the control electrode of said cascode transistor.

12. A current memory cell as claimed in claim 11 wherein the cascode transistor and the feedback transistor are of the same conductivity type as that of the respective transistor.

13. A current memory cell as claimed in claim 8 wherein at least one of the first, second and third transistors is coupled to its respective current terminal via a respective cascode circuit comprising:

at least one source of bias voltage, a cascode transistor coupled between a respective first, second or third transistor and its respective current terminal, said cascode transistor being of the same conductivity type as its respective transistor, and further means for coupling a control electrode of the cascode transistor to the bias voltage source.

14. A current memory cell as claimed in claim 8 wherein said first, second and third transistors comprise field effect transistors and the first switch connects the first transistor as a diode during the sample interval and as a current source during the hold interval.

15. A current memory cell as claimed in claim 8 wherein the first and second current terminals, the first, second and third transistors and the first and second switches are all part of an integrated circuit.

16. A current memory cell for sampling a current during a sample interval and for supplying a corresponding current during a hold interval, comprising:

first and second terminals for a supply voltage, a first current terminal, a first transistor having a control electrode, first means for coupling said first current terminal to the first supply voltage terminal via said first transistor, a capacitor connected between the control electrode and a first main electrode of the first transistor, a switch for coupling and decoupling the first transistor control electrode to and from the first current terminal during the sample interval and the hold interval, respectively, a second current terminal, second and third transistors of a conductivity type opposite to that of the first transistor and having their control electrodes interconnected, second means for coupling the first current terminal to the second supply voltage terminal via the second transistor, third means for coupling the second current terminal to the second supply voltage terminal via the third transistor, a source of bias current coupled to the second current terminal, and means for maintaining a substantially constant voltage difference between the control electrode of the third transistor and the second current terminal.

17. A current memory cell as claimed in claim 16 wherein said constant voltage maintaining means comprises a short-circuit connection between the control electrode of the third transistor and the second current terminal.

18. A current memory cell as claimed in claim 16 wherein at least one of the first, second and third transistors is coupled to its respective current terminal via a respective cascode circuit comprising:

a source of bias current, a cascode transistor coupled between a respective first, second or third transistor and its respective current terminal, a feedback transistor coupled to a control electrode of its respective cascode transistor, and fourth means coupling the bias current source to the feedback transistor and to the control electrode of said cascode transistor.

19. A current memory cell as claimed in claim 16 wherein at least one of the first, second and third transistors is coupled to its respective current terminal via a respective cascode circuit comprising:

at least one source of bias voltage, a cascode transistor coupled between a respective first, second or third transistor and its respective current terminal, said cascode transistor being of the same conductivity type as its respective transistor, and further means for coupling a control electrode of the cascode transistor to the bias voltage source.

20. A current memory cell as claimed in claim 16 wherein said second and third transistors together form a current mirror circuit.

21. A current memory cell as claimed in claim 16 wherein said first, second and third transistors comprise field effect transistors and the switch connects the first transistor as a diode during the sample interval and as a current source during the hold interval.

* * * * *